United States Patent [19]

Wilder

[11] Patent Number: 4,943,712
[45] Date of Patent: Jul. 24, 1990

[54] MOTION DETECTOR

[75] Inventor: Richard L. Wilder, Sparks, Nev.

[73] Assignee: Tahoe Products Incorporated, Sparks, Nev.

[21] Appl. No.: 281,160

[22] Filed: Dec. 7, 1988

[51] Int. Cl.$^5$ ............................................. G01V 9/04
[52] U.S. Cl. ................................ 250/221; 250/214 R; 250/338.1; 340/567
[58] Field of Search .......... 250/214 A, 214 R, 370.15, 250/338.1, 338.3, 393, 208, 209, 221; 307/311; 340/567

[56] References Cited

U.S. PATENT DOCUMENTS 3,988,726 10/1976 Reiss et al. ...................... 250/338.1

Primary Examiner—David C. Nelms
Attorney, Agent, or Firm—Townsend and Townsend

[57] ABSTRACT

A motion detector has an infrared sensor for detecting a moving infrared energy source and for generating a current which charges a timing capacitor. The timing capacitor is commonly connected to the threshold and trigger input terminals of one timer in a conventional LM 556 dual timer package. The discharge output terminal of the timer is used for flowing current to a light source or other indicator device. When the timing capacitor voltage exceeds the threshold reference voltage, the discharge output pin is rendered conductive, and the indicator device is rendered active. When motion of the infrared energy source ceases, the timing capacitor is allowed to discharge, and, when the capacitor voltage falls below the trigger reference voltage, the discharge output terminal is rendered non-conductive. A photocell is coupled to the control voltage input terminal of the timer for varying the threshold and trigger reference voltage levels in response to ambient light. In this manner, the light source or other indicator device will be rendered active only when the ambient is dark e.g., during night time. To latch the lights or other indicator devices in the active state, the trigger, threshold and reset input terminals of the second timer in the package are connected so that, when the power switch is turned off and then on in a relatively short time, the discharge output terminal of the second timer is maintained in a conductive state irrespective of the presence or absence of the moving infrared energy source.

19 Claims, 2 Drawing Sheets

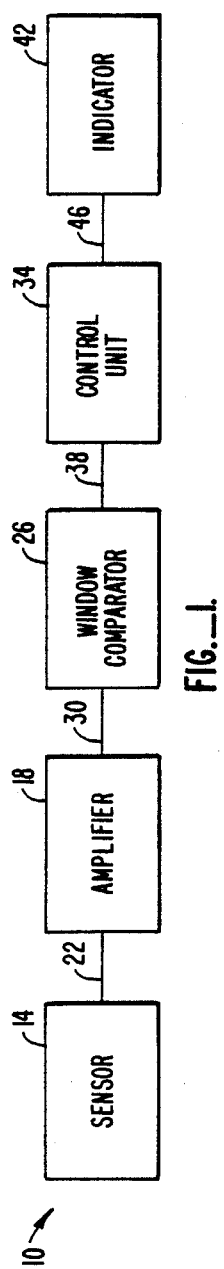
FIG._1.
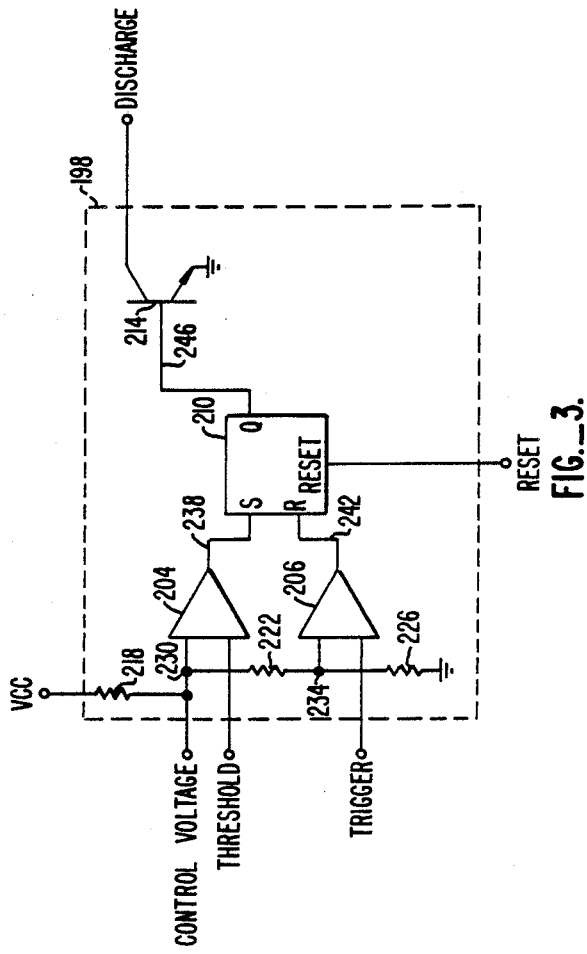
FIG._3.

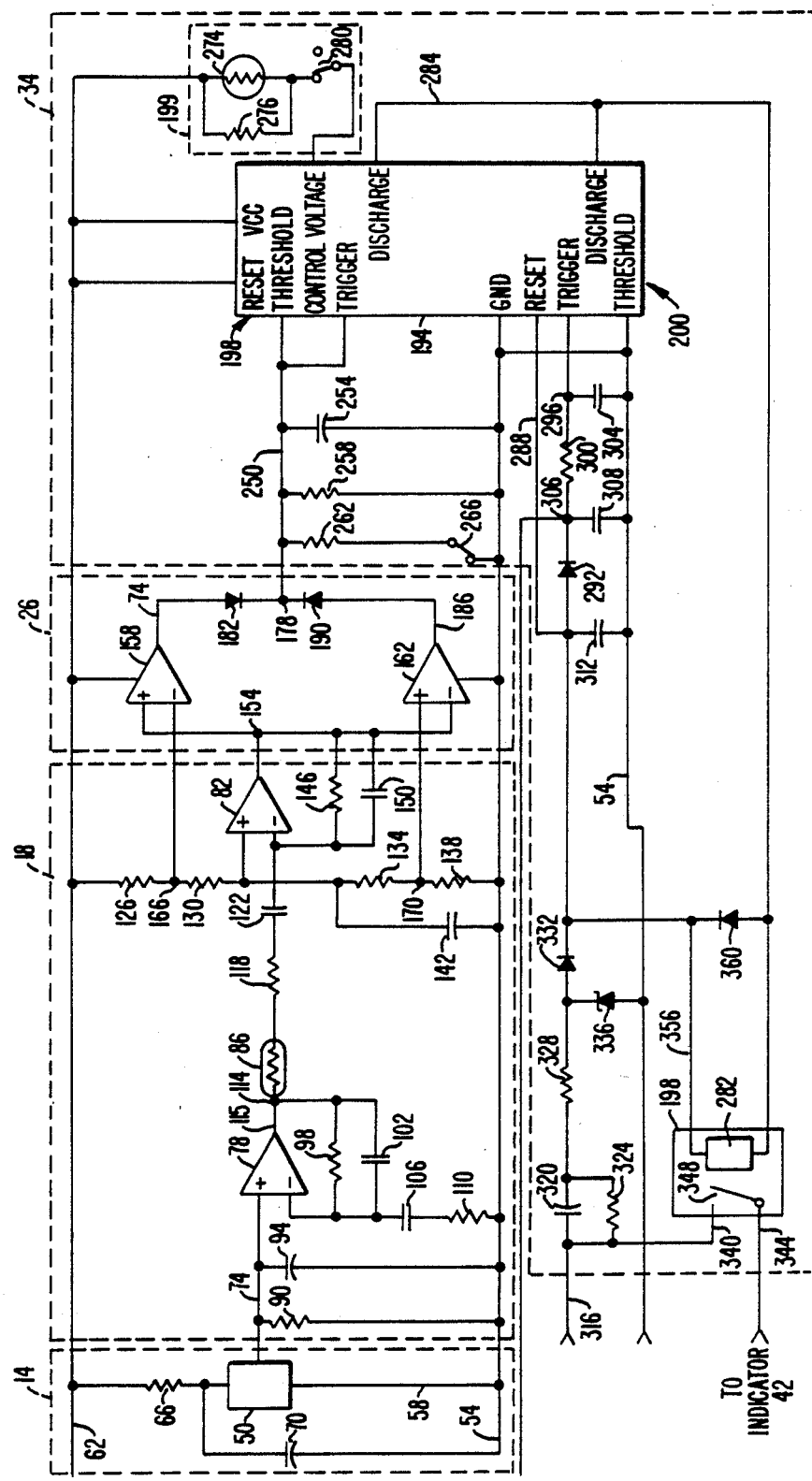
FIG._2.

MOTION DETECTOR

BACKGROUND OF THE INVENTION

1. Field of the Invention

This invention relates to motion detectors and, more particularly to a motion detector wherein timing functions, latching functions, temperature compensation and ambient light control may be integrated on a single chip.

2. Description of the Related Art

Motion detectors have become very valuable and quite popular devices as used in commercial and residential applications. One use of motion detectors is in automatic lighting control. In this application, a motion detector is coupled to a light source which is in a normally off condition. When the motion detector senses movement of a person or thing, it turns on the light source so that a person in the vicinity of the motion detector may properly view his or her surroundings which may otherwise be enveloped in darkness.

As motion detectors increase in widespread use, problems and desirable options become more apparent. For example, outside lighting typically only needs to operate at night, and having the motion detector turn on the lights all day long is a waste of energy. The sensitivity of motion detector circuitry frequently varies with temperature, and this can cause inconsistent operation through the four seasons. It also may be desireable to continue the operation of the light source for some time after the moving body either ceases to move or becomes out of range of the sensor, because in some cases the light source may still be needed. Finally, it is desirable to have the ability to override the motion sensor and allow the light source to remain on independently of the sensor.

Attempts to overcome the problems and meet the needs of known motion detectors requires the use of circuits employing a substantial number of operational amplifiers to perform the timing and latching functions noted. However, the resulting device typically must be constructed on a plurality of discrete chips, thus significantly increasing production costs. Furthermore, to compensate for temperature sensitivity, the gain of the known devices ordinarily must be adjusted manually. This results in annoyance to the user.

SUMMARY OF THE INVENTION

The present invention is directed to a motion detector wherein timing functions, latching functions, temperature compensation and ambient light control may be integrated on a single chip by using an off-the-shelf timer connected in an unconventional manner. Additionally, temperature compensation is accomplished automatically by using a temperature sensitive resistive element disposed within the amplifier stage of the motion detector.

In one embodiment of a motion detector according to the present invention, an infrared sensor detects a moving infrared energy source and generates a current for charging a timing capacitor. The timing capacitor is commonly connected to the threshold and trigger input terminals of a conventional LM 556 timer. The discharge output terminal of the timer is used for flowing current to a light source or other indicator device. When the timing capacitor voltage exceeds the threshold reference voltage, the discharge output pin is rendered conductive, and the indicator device is rendered active. When motion of the infrared energy source ceases, the timing capacitor is allowed to discharge, and, when the capacitor voltage falls below the trigger reference voltage, the discharge output terminal is rendered non-conductive.

A photocell is coupled to the control voltage input terminal of the timer for varying the threshold and trigger reference voltage levels in response to ambient light. The photocell and related components are chosen so that, when the ambient is light, the charge on the timing capacitor is insufficient to render the discharge output terminal conductive. In this manner, the light source or other indicator device will be rendered active only when the ambient is dark e.g., during night time. To latch the lights or other indicator devices in the active state, the trigger, threshold and reset input terminals of the second timer in the package are connected so that, when the power switch is turned off and then on in a relatively short time, the discharge output terminal of the second timer is maintained in a conductive state irrespective of the presence or absence of the moving infrared energy source.

BRIEF DESCRIPTION OF THE DRAWINGS

FIG. 1 is a block diagram of a motion detector according to the present invention.

FIG. 2 is a schematic diagram of the motion detector according to the present invention.

FIG. 3 is a diagram of the timer shown in FIG. 2.

DETAILED DESCRIPTION OF THE PREFERRED EMBODIMENTS

FIG. 1 is a block diagram of a motion sensor 10 according to the present invention. Motion detector 10 comprises a sensor 14 for detecting the presence of a moving body; an amplifier 18 coupled to sensor 14 through one or more lines 22 for amplifying the signals from sensor 14; a window comparator 26 coupled to amplifier 18 through one or more lines 30 for rectifying the signal from amplifier 18; a control unit 34 coupled to window comparator 26 through one or more lines 38 for providing timing, latching and ambient light control functions; and an indicator 42, coupled to control unit 34 through one or more lines 46 for providing a sensory stimulus whenever motion is detected by sensor 14. Indicator 42 may comprise a light source such as a flood lamp, a sound source such an alarm bell, or any other sensory stimulus device. Motion detector 10 operates in a manner such that, when a moving body is detected by sensor 14, indicator 42 provides a sensory stimulus for indicating that motion. In this embodiment, this sensory stimulus remains for an interval of time after the moving body is no longer detected. If desired, the operation of sensor 14 may be overridden, and indicator 42 may be operated continuously. Motion detector 10 automatically compensates for variation in ambient temperature, and it is sensitive to the level of ambient light so that it operates only when the ambient light is below a prescribed level (e.g., in the night time).

FIG. 2 is a schematic diagram of motion detector 10. As shown in FIG. 2, sensor 14 comprises a dual element pyroelectric infrared sensor 50, of well known construction, for detecting motion in the form of a moving infrared energy source (e.g., a person or car). One power terminal of infrared sensor 50 is coupled to a ground line 54 through a line 58. The other power terminal of sensor 50 is coupled to a voltage line 62 through a resistor 66. The other power terminal of infrared sensor 50 also is coupled to ground line 54 through a capacitor 70. Infrared sensor 50 produces signals on a line 74 whenever the moving infrared energy source is detected.

Amplifier 18 comprises operational amplifiers (op-amps) 78 and 82, for amplifying the signals originating on line 74, and a thermistor 86 for varying the gain of amplifier 18. The non-inverting input terminal of op-amp 78 is connected to line 74 and to one terminal of a resistor 90 and capacitor 94. The other terminals of resistor 90 and capacitor 94 are connected to ground line 54. The inverting input terminal of op-amp 78 is coupled to one terminal of a resistor 98, a capacitor 102 and a capacitor 106. The other terminal of capacitor 106 is coupled to ground line 54 through a resistor 110. The other terminals of resistor 98 and capacitor 102 are connected to a node 114 between the output terminal 115 of op-amp 78 and one terminal of thermistor 86 for providing a feed back loop.

Thermistor 86 is coupled to the inverting input terminal of op-amp 82 through serially connected resistor 118 and capacitor 122. The non-inverting input terminal of op-amp 82 is coupled to voltage line 62 through serially connected resistors 126 and 130. The non-inverting input terminal of op-amp 82 also is connected to ground line 54 through serially connected resistors 134, 138, and through a capacitor 142 connected in parallel with resistors 134 and 138. Resistors 126, 130, 134 and 138 thus form a voltage divider for providing a reference voltage to op-amp 82. As with op-amp 78, the non-inverting input terminal of op-amp 82 is coupled to one terminal of a resistor 146 and capacitor 150. The other terminals of resistor 146 and capacitor 150 are connected to an output terminal 154 of op-amp 82 for providing a feed back loop.

Thermistor 86 is a negative temperature coefficient thermistor which is used as a temperature sensitive gain controlling circuit element. In particular, the thermistor is used to vary the gain of op-amp 82 as a function of ambient temperature. Since passive infrared technology is inherently more sensitive as the ambient temperature decreases, thermistor 86 is used to decrease amplifier gain with temperature thereby accomplishing automatic temperature gain control.

Window comparator 26 comprises an op-amp 158 and an op-amp 162. Output terminal 154 of op amp 82 in amplifier section 18 is connected to the non-inverting input terminal of op-amp 158 and to the inverting terminal of op-amp 162. The inverting input terminal of op-amp 158 is connected to a node 166 between resistors 126 and 130. The non-inverting input terminal of op-amp 162 is connected to a node 170 between resistors 134 and 138. The output terminal 174 of op-amp 158 is coupled to a node 178 through a diode 182. The output terminal 186 of op-amp 162 is coupled to node 178 through a diode 190.

In operation, window comparator 26 detects a change in the output of op-amp 82 and causes either the output of op-amp 158 or the output of op-amp 162 to switch from a low to a high state. This transient is coupled through diode 182 or 190 for flowing a current to node 178 and into control unit 34.

The main components of control unit 34 are a dual timer 194, a relay 198, and an ambient light control circuit 199. Dual timer 194 is available from many sources, and it may comprise an LM 556 dual timer available from National Semiconductor Corporation of Santa Clara Calif. As a dual timer, timer 194 generally comprises a first timer 198 and a second timer 200. First timer 198 provides the basic timing functions of motion detector 10, whereas second timer 200 provides the latching function for motion detector 10.

The general structure and operation of first timer 198 may be understood by referring to FIG. 3. Second timer 200 is constructed in the same way. In general, timer 198 comprises two voltage comparators 204 and 206, a flip-flop 210, a discharge transistor 214 and a voltage divider comprising resistors 218, 222 and 226 serially connected between a voltage source (VCC) and ground. Resistors 218, 222 and 226 provide a reference voltage to comparators 204 and 206. The reference voltage input terminal of voltage comparator 204 is connected to a node 230 between resistor 218 and 222, the reference voltage input terminal of voltage comparator 206 is connected to a node 234 between resistors 222 and 226. Resistors 218, 222 and 226 typically are of equal value, so the reference voltage provided to voltage comparator 204 is approximately two-thirds VCC whereas the reference voltage applied to voltage comparator 206 is approximately one-third VCC. Node 230 is further coupled to a control voltage input terminal for selectively varying the reference voltage applied to voltage comparators 204 and 206.

The other input terminal of voltage comparator 204 comprises a threshold input terminal, and the other input terminal to voltage comparator 206 comprises a trigger input terminal. The output terminal 238 of voltage comparator 204 is connected to the R-input of flip-flop 210, whereas the output terminal 242 is connected to the S-input terminal of flip-flop 210. As configured, when the trigger voltage is moved below one-third of the supply voltage VCC, the output of voltage comparator 206 goes high for setting the $\overline{Q}$-output terminal of flip-flop 210 into a low state. On the other hand, when the threshold voltage exceeds two-thirds VCC, the output of voltage comparator 204 goes high for setting the $\overline{Q}$-output terminal of flip-flop 210 into a high state. The $\overline{Q}$-output terminal of flip-flop 210 is connected to the base of transistor 214 through a line 246. The emitter of transistor 214 is coupled to ground, and the collector of transistor 214 is coupled to a discharge output terminal. Thus, when the $\overline{Q}$-output terminal of flip-flop 210 is in a high state, transistor 214 is rendered conductive, and a low signal appears on the discharge output terminal, whereas when the $\overline{Q}$-output terminal of flip-flop 210 is in a low state, transistor 214 is rendered non-conductive, and the discharge output terminal is high. A high signal applied to the reset terminal forces the $\overline{Q}$-output terminal to be in a high state independently of the state of comparators 204 and 206.

As shown in FIG. 2, the threshold and trigger input terminals of first timer 198 are commonly coupled to node 178 through a line 250. The timing function is performed by a capacitor 254 and resistors 258 and 262, each of which has one terminal connected to line 250 and the other terminal connected to ground line 54. Resistor 262 has its other terminal coupled to ground line 54 through a switch 266 for test purposes. The reset and VCC input terminals of first timer 198 are both connected to voltage line 62. The VCC input terminal of second timer 200 is connected internally to the VCC input terminal of first timer 198. The control voltage input terminal of first timer 198 is connected to ambient light control circuit 199. comprising a photo-cell 274 connected in parallel with a resistor 276, through a switch 280. Ambient light control circuit 199 also is coupled to the supply voltage through voltage line 62. The discharge output terminal of first timer 198 is coupled to one of the control input terminals of a control winding 282 of relay 198 through a line 284.

Second timer 200 has its reset input terminal coupled to voltage line 62 through a line 288 and a diode 292. The threshold input terminal of second timer 200 is coupled to ground line 54. The trigger input terminal of second timer 200 is connected to a node 296 between first terminals of a resistor 300 and a capacitor 304. The second terminal of capacitor 304 is connected to ground line 54, whereas the second terminal of resistor 300 is connected to a node 306 between the cathode of diode 292 and one terminal of a capacitor 308. The other terminal of capacitor 308 is connected to ground line 54. A capacitor 312 is connected between the anode of diode 292 and ground line 54. The discharge terminal of second timer 200 is connected to line 284. Both first timer 198 and second timer 200 are connected to ground line 54.

Control unit 34 receives line current through ground line 54 and voltage source line 316. Source line 316 is connected to the first terminals of a capacitor 320 and a resistor 324 which, in turn, are connected in parallel. The second terminals of capacitor 320 and resistor 324 are connected to the anode of a diode 332 through a resistor 328. The cathode of diode 332 is connected to the anode of diode 292. A zener diode 336 is coupled between ground line 54 and a node 337 between resistor 328 and diode 332 to stabilize the voltage at a level usable by the system.

Relay 198 is coupled to voltage source line 316 through a line 340 for selectively providing current to indicator 42 through a line 344 in response to the position of relay switch 348. As mentioned above, one terminal of the control winding 282 is connected to line 284. The other terminal of control winding 282 is connected to the cathode of diode 332 through a line 356. A diode 360 is connected between line 284 and line 356.

As noted previously, first timer 198 performs a timing function for the motion detector and second timer 200 performs a latching function for the motion detector. In operation, motion in the form of a moving infrared energy source is detected by sensor 14 and amplified by amplifier 18. The amplified signal is communicated through window comparator 26 to node 178 and to line 250 in control unit 34. The current flowing on line 250 charges capacitor 254 which, in turn, provides a voltage to the threshold and trigger input terminals of first timer 198. When the voltage at the threshold input terminal reaches a level greater than two-thirds of the voltage at the VCC input terminal, the discharge output terminal of first timer 198 begins to conduct (i.e., is switched low). In response, the lights or other devices comprising indicator 42 are activated.

Since the threshold input terminal and trigger input terminal of first timer 198 are connected together, the discharge output terminal will remain conductive until the voltage on capacitor 254 falls below one-third the voltage at the VCC input terminal. Capacitor 254 will remain charged as long as sensor 14 detects motion, and it is only after motion ceases that capacitor 254 will discharge through resistor 258 and, if switch 266 is in the position shown, resistor 262. When the voltage on capacitor 254 falls below one-third the voltage at the VCC input terminal, the discharge output terminal is rendered non-conductive, and the lights or other devices comprising indicator 42 become inactive.

In conventional applications timer 194 typically is designed as a non-retriggerable one shot by having the discharge output terminal coupled to capacitor 254 for immediately discharging capacitor 254 whenever the threshold voltage is reached. In the device according to the present invention, capacitor 254 is allowed to remain charged until motion ceases, and the discharge output terminal is used for driving indicator 42. In effect, this unconventional configuration provides a retriggerable one-shot timer, When switch 280 is in the position shown in FIG. 2, ambient light control circuit 199 is activated. The components in control circuit 199 are chosen so that, if the ambient is light, the reference voltage level of the threshold comparator will become higher than the maximum voltage available from capacitor 254. Under this condition, detected motion will not cause the discharge output terminal to be rendered conductive, and the lights and other devices comprising indicator 42 will remain inactive. When the ambient becomes dark, the resistance of photocell 274 increases, and the reference voltage is reduced to a level sufficient to allow capacitor 254 to render the discharge output terminal conductive.

As noted previously, second timer 200 is used for independently latching indicator 42 in the active state when desired. When power is first applied to the circuit, the reset input terminal of second timer 200 immediately rises to the positive voltage. However, the trigger input terminal is initially held low by capacitor 304. The threshold input terminal is wired to ground. With this combination of inputs, the discharge output terminal of second timer 200 is non-conductive. Capacitors 304, 308 and 312 charge to the line voltage but since the threshold input terminal is wired to ground, the discharge output terminal is not rendered conductive.

When the AC power is interrupted by the user turning the indoor switch off and then on again within about one to five seconds, capacitors 308 and 312 initially discharge rapidly into the circuit, but capacitor 304 discharges slowly through resistor 300. When the switch is turned back on, the trigger input terminal remains high by the charge remaining on capacitor 304 and, since the voltage on the reset input terminal is initially lower than the voltage at the trigger input terminal, the discharge output terminal will be rendered conductive. Accordingly, the lights and other devices comprising indicator 42 will be latched in the active state independent of any motion or lack thereof, since the trigger input terminal is now maintained at a high level. To remove the latched condition, power is switched off for approximately fifteen seconds or more, thereby allowing all capacitors to discharge. Reapplying power will cause the circuit to operate in the ordinary way.

While the above is a complete description of a preferred embodiment of the present invention, various modifications may be employed. For example, two single timers may be used instead of the dual timers shown. Consequently, the scope of the invention should not be limited except as properly described in the claims.

What is claimed is:

1. A motion detecting circuit comprising:

motion detecting means for detecting a moving infrared energy source and for generating a motion detected signal in response thereto;

first current flowing means, coupled to the motion detecting means, for flowing a first current in response to the motion detected signal;

a first capacitance, coupled to the current flowing means, for providing a voltage in response to the current flowing from the current flowing means;

first voltage detecting means, coupled to the first capacitance, for detecting a first voltage value;

second voltage detecting means, coupled to the first capacitance, for detecting a second voltage value that is higher than the first voltage value;

second current flowing means, coupled to the first voltage detecting means and to the second voltage detecting means, for flowing a second current when the voltage provided by the first capacitance is above the second voltage value and for inhibiting the second current flow when the voltage provided by the first capacitance is below the first voltage value: and motion indicating means, coupled to the second current flowing means, for providing a sensory stimulus in response to the second current.

2. The circuit according to claim 1 wherein the motion detecting means ceases generating the motion detected signal when the moving infrared energy source is not detected.

3. The circuit according to claim 2 wherein the first current flowing means ceases flowing the first current when the motion detected signal is not generated by the motion detecting means, so that the first capacitance is allowed to discharge.

4. The circuit according to claim 3 wherein the first voltage detecting means further comprises:

first reference voltage means for generating a first reference voltage equal to the first voltage value; and first reference comparing means, coupled to the first reference voltage means and to the first capacitance, for comparing the voltage provided by the first capacitance to the first reference voltage and for providing a signal to the second current flowing means when the voltage provided by the first capacitance is below the first voltage value.

5. The circuit according to claim 3 wherein the second voltage detecting means further comprises:

second reference voltage means for generating a reference voltage equal to the second voltage value; and second reference comparing means, coupled to the second reference voltage means and to the first capacitance, for comparing the voltage provided by the first capacitance to the second reference voltage and for providing a signal to the second current flowing means when the voltage provided by the first capacitance is above the second voltage value.

6. The circuit according to claim 5 further comprising:

light detecting means for detecting a level of ambient light; and first reference voltage altering means, coupled to the light detecting means and to the first reference voltage means, for altering the first reference voltage in response to the level of ambient light detected by the light detected means.

7. The circuit according to claim 5 further comprising:

light detecting means for detecting a level of ambient light; and second reference voltage altering means, coupled to the light detecting means and to the second reference voltage means, for altering the second reference voltage in response to the level of ambient light detected by the light detected means.

8. The circuit according to claim 5 further comprising:

light detecting means for detecting a level of ambient light; and reference voltage altering means, coupled to the light detecting means, to the first reference voltage means and to the second reference voltage means, for altering the first and second reference voltages in response to the level of ambient light detected by the light detected means.

9. The motion detecting circuit according to claim 1 further comprising:

third current flowing means for selectively flowing a third current for providing a voltage;

third voltage detecting means, coupled to the third current flowing means, for detecting a third voltage value;

fourth voltage detecting means, coupled to the third current flowing means, for detecting a fourth voltage value that is higher than the third voltage value;

fourth current flowing means, coupled to the third voltage detecting means and to the fourth voltage detecting means, for flowing a fourth current when the voltage provided by the third current flowing means is above the fourth voltage value and for inhibiting the fourth current flow when the voltage provided by the third current flowing means is below the third voltage value;

voltage setting means, coupled to the third current flowing means, to the third voltage detecting means and to the fourth voltage detecting means, for setting the voltage provided to the third voltage detecting means above the voltage provided to the fourth voltage detecting means; and override means, coupled to the third current flowing means and to the fourth current flowing means, for causing the fourth current flowing means to flow the fourth current when the voltage provided by the third current flowing means momentarily falls below the third voltage value.

10. The circuit according to claim 9 wherein the voltage setting means further comprises a second capacitance, coupled to the third current flowing means and to the third voltage detecting means, for providing the voltage to the third voltage detecting means in response to the current flowing from the third current flowing means.

11. The circuit according to claim 10 further comprising:

a third capacitance, coupled to the third current flowing means and to the override means, for providing an override voltage to the override means in response to the current flowing from the third current flowing means.

12. The circuit according to claim 11 wherein the third current flowing means further comprises capacitance discharge means, coupled to the third and fourth capacitances, for causing the third and fourth capacitances to discharge when the third current is inhibited.

13. The circuit according to claim 12 wherein the override means further comprises discharge rate means, coupled to the second capacitance, for causing the second capacitance to discharge at a slower rate than the third capacitance so that, when the third current is momentarily inhibited, the override voltage momentarily drops below the third voltage value, and the override means causes the fourth current flowing means to flow current.

14. A current latching circuit comprising:
 first current flowing means for selectively flowing a first current for providing a voltage:
 first voltage detecting means, coupled to the first current flowing means, for detecting a first voltage value;
 second voltage detecting means, coupled to the first current flowing means, for detecting a second voltage value that is higher than the first voltage value;
 second current flowing means, coupled to the first voltage detecting means and to the second voltage detecting means, for flowing a second current when the voltage provided by the first current flowing means is above the second voltage value and for inhibiting the second current flow when the voltage provided by the first current flowing means is below the first voltage value:
 voltage setting means, coupled to the first current flowing means, to the first voltage detecting means and to the second voltage detecting means, for setting the voltage provided to the first voltage detecting means above the voltage provided to the second voltage detecting means; and
 override means, coupled to the first current flowing means and to the second current flowing means, for causing the second current flowing means to flow the second current when the voltage provided by the first current flowing means momentarily falls below the first voltage value.

15. The circuit according to claim 14 wherein the voltage setting means further comprises a first capacitance, coupled to the first current flowing means and to the first voltage detecting means, for providing the voltage to the first voltage detecting means in response to the current flowing from the first current flowing means.

16. The circuit according to claim 15 further comprising:
 a second capacitance, coupled to the first current flowing means and to the override means, for providing an override voltage to the override means in response to the current flowing from the first current flowing means.

17. The circuit according to claim 16 wherein the first current flowing means further comprises capacitance discharge means, coupled to the first and second capacitances, for causing the first and second capacitances to discharge when the first current is inhibited.

18. The circuit according to claim 17 wherein the override means further comprises discharge rate means, coupled to the second capacitance, for causing the first capacitance to discharge at a slower rate than the second capacitance so that, when the first current is momentarily inhibited, the override voltage momentarily drops below the first voltage value, and the override means causes the second current flowing means to flow current.

19. The circuit according to claim 18 wherein the override means causes the second current flowing means to flow the second current until the first capacitance is substantially completely discharged by the capacitance discharge means.

* * * * *